(12) United States Patent
Moriya et al.

(10) Patent No.: US 6,878,464 B2
(45) Date of Patent: Apr. 12, 2005

(54) GLASS-CERAMIC COMPOSITE MATERIAL AND MULTILAYERED CIRCUIT SUBSTRATE

(75) Inventors: Yoichi Moriya, Omihachiman (JP); Osamu Chikagawa, Shiga-ken (JP); Yasutaka Sugimoto, Kyoto (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 10/277,045

(22) Filed: Oct. 22, 2002

(65) Prior Publication Data

US 2003/0118842 A1 Jun. 26, 2003

(30) Foreign Application Priority Data

Oct. 22, 2001 (JP) ........................................ 2001-323755
Aug. 20, 2002 (JP) ........................................ 2002-238901

(51) Int. Cl.[7] ................................................ B32B 9/00
(52) U.S. Cl. ........................ 428/632; 428/209; 428/210; 428/699; 428/697; 428/701; 428/702; 501/2; 501/5; 501/8; 501/55; 501/65
(58) Field of Search ................................ 428/209, 210, 428/621, 630, 632, 689, 699, 697, 701, 702; 501/2, 5, 8, 55, 65

(56) References Cited

U.S. PATENT DOCUMENTS

| 6,133,175 | A | * | 10/2000 | Bethke et al. ................... 501/8 |
| 6,348,427 | B1 | * | 2/2002 | Hamada et al. ................ 501/32 |
| 6,403,200 | B2 | * | 6/2002 | Chikagawa et al. ......... 428/209 |
| 6,407,020 | B1 | * | 6/2002 | Ohkawa et al. ................ 501/32 |
| 6,447,888 | B2 | * | 9/2002 | Suzuki et al. ................ 428/210 |
| 6,452,264 | B2 | * | 9/2002 | Nishide et al. .............. 257/703 |
| 6,623,845 | B1 | * | 9/2003 | Katsumura et al. .......... 428/210 |
| 2001/0022237 | A1 | * | 9/2001 | Suzuki et al. ................ 174/256 |
| 2002/0039645 | A1 | * | 4/2002 | Kawai et al. ................ 428/210 |
| 2002/0094929 | A1 | * | 7/2002 | Kawai et al. .................. 501/32 |

FOREIGN PATENT DOCUMENTS

| JP | 07-118060 | 5/1995 |
| JP | 2001-058849 | 3/2001 |
| JP | 2001-114554 | 4/2001 |
| JP | 2001-247359 | 9/2001 |
| JP | 2001-247360 | 9/2001 |

* cited by examiner

*Primary Examiner*—Deborah Jones
*Assistant Examiner*—G. Blackwell-Rudasill
(74) *Attorney, Agent, or Firm*—Dickstein, Shapiro, Morin & Oshinsky, LLP.

(57) ABSTRACT

A glass-ceramic composite material for use in forming a multilayered circuit substrate is provided which has a low dielectric constant, but exhibits a relatively high thermal expansion coefficient. Specifically, the glass-ceramic composite material comprises a glass power and a ceramic powder. The glass powder contains: about 30 to 60 mol % of $SiO_2$, about 20 to 40 mol % of BaO, 0 to about 40 mol % of MgO, 0 to about 40 mol % of ZnO, 0 to about 20 mol % of $B_2O_3$, with the total content of MgO and ZnO being about 10 to 40 mol %. The ceramic powder contains an alumina powder. The content of the glass powder is set to be at least about 50 wt %. A sintered compact formed by sintering the above glass powder and the above ceramic powder contains a $BaO.Al_2O_3.2SiO_2$ ($BaAl_2Si_2O_8$) crystal, and its Q value becomes about 400 or more when a measured frequency is 10 GHz.

18 Claims, 2 Drawing Sheets

GLASS-CERAMIC COMPOSITE MATERIAL AND MULTILAYERED CIRCUIT SUBSTRATE

BACKGROUND OF THE INVENTION

1. Field of the Invention

The present invention relates to a glass-ceramic composite material and a multilayered circuit substrate formed by using the glass-ceramic composite material. In particular, this invention relates to a glass-ceramic composite material for use in forming a multilayered circuit substrate capable of ensuring a low dielectric constant and a relatively high thermal expansion coefficient. In addition, this invention also relates to a multilayered circuit substrate formed by using such a glass-ceramic composite material.

2. Description of the Related Art

Since more and more electric devices have been made compact in recent years, many electronic parts for use in these electronic devices have also been required to be made compact in size. It is effective to employ circuit substrates capable of mounting electronic parts for use in these electronic devices in order to manufacture electronic devices which are compact in size. Further, a circuit substrate usually includes a laminated body formed by a plurality of electrically insulating layers. Accordingly, if a multilayered circuit substrate provided with conductive patterns is employed by making use of the laminated body, it is possible for the multilayered circuit substrate to contain in itself some electronic elements such as condensers and inductors, thereby further promoting the production of electronic devices which are all compact in size.

In the aforementioned multilayered circuit substrate, a ceramic is usually favorably employed as the material for forming the electrically insulating layers. However, in a case where the electrically insulating layers are formed by a ceramic material, a sintering process is usually carried out to form the laminated body including a plurality of ceramic layers laminated one above another. When such a sintering process is being carried out, the conductive pattern provided within the laminated body will also be sintered at the same time.

Electronic devices have not only been required to be made compact in size in recent years, but also to be capable of being used in a high frequency area.

In order for a multilayered circuit substrate to be suitably used in a high frequency area, it is necessary that the conductive pattern be made of a material having a low electric resistance. For this reason, an electrically conductive component contained in the conductive patterns has to be a metal having a low electric resistance, such as copper or silver.

A low resistance metal such as copper and silver also has a low melting point. Because of this, when the aforementioned sintering process is carried out and also sinters the conductive patterns containing such a low melting point metal, the ceramic material contained in the ceramic layers has to be sintered at a temperature of 1000° C. or lower in order to produce a desired laminated body including a plurality of ceramic layers.

A glass-ceramic composite material formed by adding a glass into a ceramic can be used as a material which can be sintered at a temperature of 1000° C. or lower.

If the multilayered circuit substrate is to be used in a high frequency area, as well as to mount conductive patterns with a high density, it is necessary for the electrically insulating layers to have a low dielectric constant. If the aforementioned glass-ceramic composite material is used as a material forming the electrically insulating layers, such a glass-ceramic composite material is required to have a relatively low dielectric constant. However, in a case where condensers are contained within the multilayered circuit substrate, the glass-ceramic composite layers providing such condensers are required to have a relatively high dielectric constant.

If a laminated body for use in forming the multilayered circuit substrate has a composite structure including glass-ceramic composite layers having a relative low dielectric constant and other glass-ceramic layers having a relative high dielectric constant, it will be possible to provide condensers having a large capacity but a small volume in portions having a relative high dielectric constant, and to provide a structure in other portions capable of satisfying the requirement concerning a high frequency as well as a requirement concerning a high density wiring.

However, in general, a glass-ceramic composite material having a high dielectric constant usually exhibits a high thermal expansion coefficient, while a glass-ceramic composite material having a low dielectric constant usually exhibits a low thermal expansion coefficient.

For this reason, the two kinds of glass-ceramic composite layers will exhibit mutually different thermal expansions and mutually different shrinking behaviors in the sintering process for producing a laminated body having a composite structure including two kinds of glass-ceramic composite layers having different dielectric constants. As a result, it is quite possible that defects such as crackings will occur in the obtained laminated body.

The aforementioned problems, however, can be solved if it is possible to produce a glass-ceramic composite material having a low dielectric constant but a relatively high thermal expansion coefficient.

SUMMARY OF THE INVENTION

Accordingly, it is an object of the present invention to provide an improved glass-ceramic composite material having a low dielectric constant but a relatively high thermal expansion coefficient.

It is another object of the present invention to provide an improved multilayered circuit substrate formed by making use of the aforementioned glass-ceramic composite material.

In particular, this invention is directed to a glass-ceramic composite material for use in forming the aforementioned glass-ceramic layers provided in the multilayered circuit substrate, which circuit substrate comprises a laminated body formed by a plurality of glass-ceramic composite layers laminated together and conductive patterns provided in relation to the laminated body.

In order to solve the above technical problems which exists in the above-described conventional multilayered circuit substrate, the glass-ceramic composite material formed according to the present invention comprises an amount of a glass powder containing about 30 to 60 mol % of a silicon oxide calculated as $SiO_2$, about 20 to 40 mol % of a barium oxide calculated as BaO, 0 to about 40 mol % of magnesium oxide calculated as MgO, 0 to about 40 mol % of a zinc oxide calculated as ZnO, 0 to about 20 mol % of a boron oxide calculated as $B_2O_3$, with the total content of MgO and ZnO being about 10 to 40 mol %; and an amount of a ceramic powder consisting of an alumina powder or consisting of a powder mixture containing alumina and spinel.

The content of the above glass powder is set to be at least about 50 wt % with respect to a total amount of the glass power and the ceramic powder.

A sintered compact obtained by sintering the mixture of the glass powder and the ceramic powder is characterized in that it contains a crystal phase represented by $BaO \cdot Al_2O_3 \cdot 2SiO_2$ ($BaAl_2Si_2O_8$).

It is possible for the above sintered compact to obtain Q value of at least about 400 when a measured frequency is 10 GHz.

Preferably, the glass-ceramic composite material for use in forming the multilayered circuit substrate according to the present invention is formed so that the dielectric constant of its glass powder is about 7 or lower and the dielectric constant of its ceramic powder is about 10 or lower, while the sintered compact obtained by sintering the mixture of the glass powder and the ceramic powder has a dielectric constant of about 9 or lower.

Moreover, the sintered compact obtained by sintering the mixture of the glass powder and the ceramic powder can further contain at least one crystal phase selected from the group consisting of $BaO \cdot Al_2O_3$ ($BaAl_2O_4$) crystal phase, $BaO \cdot 2MgO \cdot 2SiO_2$ ($BaMg_2Si_2O_7$) crystal phase, $MgO \cdot Al_2O_3$ ($MgAl_2O_4$) crystal phase and $ZnO \cdot Al_2O_3$ ($ZnAl_2O_4$) crystal phase.

When alumina is used as the ceramic, the percentage of an alumina crystal in the entire sintered compact obtained by sintering the mixture of the glass powder and the ceramic powder is at most half of the percentage of the entire unsintered alumina powder.

The sintered compact obtained by sintering the mixture of the glass powder and the ceramic powder is further preferred to be formed such that the percentage of its $BaO \cdot Al_2O_3 \cdot 2SiO_2$ ($BaAl_2Si_2O_8$) crystal is about 1 to 80 wt %.

The aforementioned glass powder is moreover preferred to be limited to a composition containing about 35 to 55 mol % of a silicon oxide calculated as $SiO_2$, about 20 to 40 mol % of a barium oxide calculated as BaO, about 10 to 30 mol % of magnesium oxide calculated as MgO, 0 to about 10 mol % of a zinc oxide calculated as ZnO, 0 to about 10 mol % of a boron oxide calculated as $B_2O_3$, with the total content of MgO and ZnO being about 10 to 30 mol %.

In addition, the content of the glass powder is preferred to be further limited to the range of about 60 to 90 wt % with respect to a total amount of the glass powder and the ceramic powder.

When the glass powder contains a silicon oxide, a barium oxide, a magnesium oxide, a zinc oxide and a boron oxide, totally having 100 parts by weight calculated as $SiO_2$, BaO, MgO, ZnO and $B_2O_3$, respectively, it can also contain about 2 parts or less by weight of a titanium oxide calculated as $TiO_2$.

When the glass powder contains a silicon oxide, a barium oxide, a magnesium oxide, a zinc oxide and a boron oxide, totally having 100 parts by weight calculated as $SiO_2$, BaO, MgO, ZnO and $B_2O_3$, respectively, it can contain about 30 parts or less by weight of an aluminium oxide calculated as $Al_2O_3$.

When the glass powder contains a silicon oxide, a barium oxide, a magnesium oxide, a zinc oxide and a boron oxide, totally having 100 parts by weight calculated as $SiO_2$, BaO, MgO, ZnO and $B_2O_3$, respectively, it can contain about 5 parts or less by weight of a lithium oxide calculated as $Li_2O$, about 5 parts or less by weight of a sodium oxide calculated as $Na_2O$, and/or about 5 parts or less by weight of a potassium oxide calculated as $K_2O$. The total amount of $Li_2O$, $Na_2O$ and $K_2O$ is set to be about 5 parts or less by weight.

The glass-ceramic composite material for use in forming the multilayered circuit substrate of the present invention, can contain about 3 parts by weight of a copper oxide calculated as CuO, with respect to 100 parts by weight of the glass powder and the ceramic powder.

The present invention is also directed to a multilayered circuit substrate comprising a laminated body formed by a plurality of mutually laminated glass-ceramic composite layers, and conductive patterns provided in relation to the laminated body. In such a multilayered circuit substrate, the glass-ceramic composite layers are formed by the glass-ceramic composite materials for use in forming the multilayered circuit substrate of the present invention.

The present invention is also directed to a multilayered circuit substrate comprising a laminated body having a composite structure formed by a plurality of mutually laminated first glass-ceramic composite layers and a plurality of mutually laminated second glass-ceramic composite layers having a dielectric constant of about 15 or higher; and conductive patterns provided in relation to the laminated body. In such a multilayered circuit substrate, the first glass-ceramic composite layers are formed by the glass-ceramic composite material for use in forming the multilayered circuit substrate of the present invention.

In the above-described multilayered circuit substrate, the conductive patterns, which serve as an electrically conductive component, is preferred to contain copper or silver.

DESCRIPTION OF THE PREFERRED EMBODIMENTS

Figure 1:
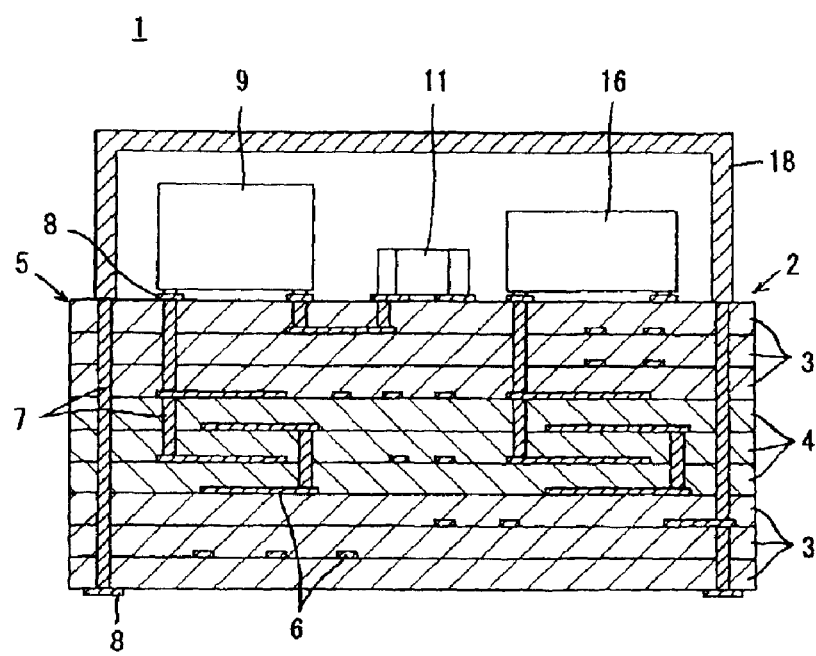
FIG. 1 is a cross sectional view showing an electronic parts module 1 including a multilayered circuit substrate 2 formed according to an embodiment of the present invention.

The glass-ceramic composite material for use in forming the multilayered circuit substrate of the present invention is a material containing both a glass powder and a ceramic powder, and in the form of a sintered compact obtained by sintering a mixture of the glass powder and the ceramic powder, characterized in that it comprises a $BaO \cdot Al_2O_3 \cdot 2SiO_2$ ($BaAl_2Si_2O_8$) crystal phase. When such a crystal phase is precipitated, the Q value will increase. In the present invention, the Q value will rise to 400 or higher when the measured frequency is 10 GHz.

The glass powder contained in the glass-ceramic composite material of the present invention contains about 30 to 60 mol % of a silicon oxide calculated as $SiO_2$, about 20 to 40 mol % of a barium oxide calculated as BaO, 0 to about 40 mol % of a magnesium oxide calculated as MgO, 0 to about 40 mol % of a zinc oxide calculated as ZnO, and 0 to about 20 mol % of a boron oxide calculated as $B_2O_3$, with the total content of MgO and ZnO being about 10 to 40 mol %.

The reasons as to why the content of the silicon oxide is set within a range of about 30 to 60 mol % calculated in accordance with $SiO_2$, can be explained as follows.

Namely, if the above content is less than about 30 mol %, there will be a possibility that the sintered compact obtained by sintering a mixture of the glass powder and the ceramic powder will produce only a small amount of precipitated $BaO.Al_2O_3.2SiO_2$ ($BaAl_2Si_2O_8$) or $BaO.2MgO.2SiO_2$ ($BaMg_2Si_2O_7$) which are the crystallized phases capable of increasing the Q value, hence undesirably reducing the Q value. On the other hand, if the above content is larger than about 60 mol %, there will be a possibility that the melting point of the glass forming the glass powder will be undesirably increased.

The reasons as to why the content of the boron oxide is set within a range of 0 to about 20 mol % calculated in accordance with $B_2O_3$, can be explained as follows.

The boron oxide is mainly used as a flux in the present invention. If the content of the boron oxide is larger than about 20 mol %, a sintered compact obtained by sintering a mixture of the glass powder and the ceramic powder will only have a low moisture resistance and a low elution resistance. Moreover, an increase in the residual carbon contained in the sintered compact will cause the finally obtained multilayered circuit substrate to have only a low strength.

The reasons as to why the contents of the magnesium oxide and the zinc oxide are all set within a range of 0 to about 40 mol % calculated as MgO and ZnO, and as to why a total content of MgO and ZnO should be set at about 10 to 40%, can be explained as follows.

The magnesium oxide and the zinc oxide used in the present invention can serve to lower the melting point of the glass powder during the glass manufacturing process, and can also serve as components forming crystals in the crystallized glass. In particular, compound crystals including $BaO.2MgO.2SiO_2$ ($BaMg_2Si_2O_7$) crystal phase, $MgO.Al_2O_3$ ($MgAl_2O_4$) crystal phase and $ZnO.Al_2O_3$ ($ZnAl_2O_4$) crystal phase and the like, which are precipitated from glass or precipitated through the combination of the glass with alumina ($Al_2O_3$) or spinel ($MgO.Al_2O_3$) forming a ceramic powder to be added as a filler, will be precipitated so as to mainly serve to produce a high frequency characteristic. If the total content of MgO and ZnO is less than about 10 mol %, there will be a possibility that the precipitation of these compound crystals will be decreased and the Q value will become low. On the other hand, if the content of MgO is larger than about 40 mol % or if the content of ZnO is larger than about 40 mol %, or if the total content of MgO and ZnO is larger than about 40 mol %, there will be a possibility that the precipitation of the above compound crystals will become excessive, resulting in a low strength for a finally obtained multilayered circuit substrate.

The reasons as to why the content of the barium oxide is set within a range of about 20 to 40 mol % calculated as BaO, can be explained as follows. Similar to the magnesium oxide and the zinc oxide, the barium oxide used in the present invention can also serve as a component for forming a crystal in the crystallized glass. In particular, compound crystals including $BaO.Al_2O_3.2SiO_2$ ($BaAl_2Si_2O_8$) crystal phase, $BaO.Al_2O_3$ ($BaAl_2O_4$) crystal phase and $BaO.2MgO.2SiO_2$ ($BaMg_22Si_2O_7$) crystal phase and the like, which are precipitated from glass or precipitated through the combination of the glass with alumina or spinel forming ceramic powders to be added as a filler, will be precipitated so as to mainly serve to produce a high frequency characteristic. If the content of the barium oxide is less than about 20 mol % calculated as BaO, there will be a possibility that the precipitation of the above compound crystals will be decreased and the Q value will become low. On the other hand, if the content of the barium oxide is larger than about 40 mol %, there will be a possibility that the precipitation of the above compound crystals will become excessive, resulting in a low strength in the finally obtained multilayered circuit substrate.

If it is desired for the various oxides contained in the glass powder to produce more exact desired actions in a desired manner, it is preferable to further limit the contents of the oxides in the following ranges. Namely, the glass powder should contain about 35 to 55 mol % of the silicon oxide calculated as $SiO_2$, about 20 to 40 mol % of the barium oxide calculated as BaO, about 10 to 30 mol % of the magnesium oxide calculated as MgO, 0 to about 10 mol % of the zinc oxide calculated as ZnO, and 0 to about 10 mol % of the boron oxide calculated as $B_2O_3$, with the total content of MgO and ZnO being about 10 to 30 mol %.

Further, when the glass powder contains the above silicon oxide, the barium oxide, the magnesium oxide, the zinc oxide and the boron oxide, totally having 100 parts by weight calculated as $SiO_2$, BaO, MgO, ZnO, and $B_2O_3$, respectively, it is preferable to contain only about 2 parts by weight or less, preferably about 0.5 parts by weight or less of the titanium oxide calculated as $TiO_2$.

Usually, the titanium oxide such as $TiO_2$ is added to increase the dielectric constant of the composite material. However, since an object of the present invention is to provide a multilayered circuit substrate capable of improving the signal transmission characteristic in a high frequency area, it is not preferable to contain too much titanium oxide.

Moreover, titanium oxide can sometimes be added as a nucleation agent for promoting the crystal precipitation from glass, making it possible to expect an improved Q value by virtue of an improved crystalizability. On the other hand, the inventors of the present invention have made clear the following facts based on their experiments.

Namely, in the glass-related components forming the glass powder contained in the glass-ceramic composite material of the present invention, adding the titanium oxide does not play a role as a nucleation agent. As a result, it is impossible to improve the crystalizability. In contrast, a larger adding amount of the titanium oxide will result in a lower Q value. For this reason, although it is not absolutely necessary to remove the titanium oxide contained as an impurity in the raw material for producing glass, it is not necessary either to intentionally add such a titanium oxide as an intended ingredient.

When the glass powder contains a silicon oxide, a barium oxide, a magnesium oxide, a zinc oxide and a boron oxide, totally having 100 parts by weight calculated as $SiO_2$, BaO, MgO, ZnO, and $B_2O_3$, respectively, it is also allowed to contain about 30 parts or less by weight of an aluminium oxide calculated as $Al_2O_3$. In this respect, it is preferable to add the aluminium oxide if it is desired to improve the chemical stability of the glass. On the other hand, since the glass-ceramic composite material according to the present invention contains not only the glass powder, but also the ceramic powder, and since the ceramic powder is an alumina powder or a powder mixture formed by mixing together an alumina powder and a spinel powder, the subsequent sintering process will cause the aluminium oxide to be melted in the glass, so that the sintered glass phase will be in a state containing the aluminium oxide. Thus, although it is necessary to ensure the chemical stability, it is not necessary to have the aluminium oxide contained in the glass powder.

On the other hand, since it is possible to adjust the softening point of the glass forming the glass powder and to allow the glass itself to increase its strength once the glass powder contains the aluminium oxide, the glass powder may contain such an aluminium oxide without bringing about any trouble. However, in the case where the aluminium oxide is added as one component for forming the glass, it causes the Q value of a finally obtained multilayered circuit substrate to tend to be low. Therefore, the content of the aluminium oxide is not allowed to exceed about 30 parts by weight based on the silicon oxide serving as a main component being 100 parts by weight.

Moreover, when the glass powder contains a silicon oxide, a barium oxide, a magnesium oxide, a zinc oxide and a boron oxide, totally having 100 parts by weight calculated as $SiO_2$, BaO, MgO, ZnO, and $B_2O_3$, respectively, it is preferable to contain about 5 parts or less by weight of a lithium oxide calculated as $Li_2O$, about 5 parts or less by weight of a sodium oxide calculated as $Na_2O$, and/or about 5 parts or less by weight of a potassium oxide calculated as $K_2O$. The total amount of $Li_2O$, $Na_2O$ and $K_2O$ should be about 5 parts or less by weight.

Although the potassium oxide can function to lower the glass melting point during glass manufacturing process, the Q value will be decreased or the elution resistance will be lowered if the content of the potassium oxide is larger than the aforementioned range. An increase in the residual carbon contained in the sintered compact of the glass-ceramic composite material will tend to lower the strength of a multilayered circuit substrate.

In practice, the glass powder contained in the glass-ceramic composite material of the present invention is also allowed to be a material obtained by pre-sintering the glass composition at a temperature of about 700 to 1400° C., thereby obtaining the same effects.

The ceramic powder contained in the glass-ceramic composite material of the present invention can be either an alumina ($Al_2O_3$) powder used alone or a powder mixture containing the alumina and a spinel ($MgO.Al_2O_3$).

By using the alumina as the ceramic powder, the ceramic powder will react with the glass during the sintering process, so as to precipitate $BaO.Al_2O_3.2SiO_2$ ($BaAl_2Si_2O_8$) crystal phase, $BaO.Al_2O_3$ ($BaAl_2O_4$) crystal phase, $MgO.Al_2O_3$ ($MgAl_2O_4$) crystal phase and $ZnO.Al_2O_3$ ($ZnAl_2O_4$) crystal phases, each having a high Q value, thereby making it possible to increase the Q value of the finally obtained multilayered circuit substrate.

The amount of the above ceramic powder is set to be about 50 wt % or less, with respect to the total amount of the glass powder and the ceramic powder. If the amount of the ceramic powder is larger than about 50 wt %, the relative density of an obtained multilayered circuit substrate will be low, resulting in a low transverse strength as well as a low withstand voltage.

More preferably, the amount of the above ceramic powder is set in a manner such that the content of such ceramic powder will be about 10 to 40 wt %, with respect to the total amount of the glass powder and the ceramic powder.

Preferably, the percentage of an alumina crystal in the entire sintered compact obtained by sintering the mixture of the glass powder and the ceramic powder, is at most half of the percentage of the alumina powder added as a ceramic powder.

In a case where the glass powder is a material formed by a glass having the above-described composition range according to the present invention, an alumina powder is added to the glass and a sintering process is carried out, the alumina powder will react with the glass so that the amount of the alumina power will be decreased. Since the reaction between the alumina powder and the glass powder will cause the precipitation of $BaO.Al_2O_3.2SiO_2$ ($BaAl_2Si_2O_8$) crystal phase having a high Q value, it is possible to obtain a multilayered circuit substrate having a high Q value. Further, it is known that alumina itself is a crystal having a high Q value. However, if such an alumina is present as a fillerand its volume percentage with respect to an entire multilayered circuit substrate is relatively low, it is impossible to obtain a multilayered circuit substrate having a sufficiently high Q value. On the other hand, if an alumina powder is added as a ceramic powder and is caused to react with the glass to produce the above-described crystal having a high Q value, the percentage of crystal having a high Q value and present in the multilayered circuit substrate will become high, thereby ensuring a higher Q value than that of an alumina existing only as an alumina crystal.

In the way described above, the percentage of the alumina crystal in the sintered compact obtained by sintering the mixture of the glass powder and the ceramic powder is preferable half or less of the percentage of the alumina powder added as the ceramic powder. The remaining amount of alumina powder is calculated by finding the difference between the amount of the alumina powder and the amount of the alumina crystal consumed in forming the $BaO.Al_2O_3.2SiO_2$ ($BaAl_2Si_2O_8$) crystal which has a high Q value.

Since the $BaO.Al_2O_3.2SiO_2$ ($BaAl_2Si_2O_8$) crystal is a crystal having a high Q value, it is preferable that the percentage of the $BaO.Al_2O_3.2SiO_2$ ($BaAl_2Si_2O_8$) crystal, with respect to the sintered compact obtained by sintering the mixture of the glass powder and the ceramic powder, is about 1 to 80 wt % if the Q value of the composite material is to be improved.

Further, the glass-ceramic composite material according to the present invention is preferable formed by using a glass powder having a dielectric constant of about 7 or lower and a ceramic powder having a dielectric constant of about 10 or lower, so that the sintered compact obtained by sintering the mixture of the glass powder and the ceramic powder has a dielectric constant of about 9 or lower.

Moreover, the glass-ceramic composite material according to the present invention, which is formed by the above glass powder and the above ceramic powder, is also allowed to contain a copper oxide. The copper oxide is preferable to be added in an amount of about 3 wt % calculated as CuO, with respect to the total amount of 100 parts by weight of the mixture including the glass powder and the ceramic powder. The copper oxide will play a role of lowering the melting point of the composite material. However, the Q value of the composite material will decrease if the content of the copper oxide is larger than about 3 parts by weight.

The glass-ceramic composite material according to the present invention can be used to form the glass-ceramic layers in forming the multilayered circuit substrate which comprises a laminated body formed by a plurality of mutually laminated glass-ceramic composite layers, and conductive patterns provided in relation to the laminated body.

Further, since the glass-ceramic composite material of the present invention can be sintered at a temperature of 1000° C. or lower, the electrically conductive component of the conductive patterns is allowed to be a metal having a low melting point, which may be copper or silver.

The sintered compact obtained by sintering the mixture of the glass powder and the ceramic powder and contained in the glass-ceramic composite material of the present invention, can ensure that the Q value when a measured frequency is 10 GHz will be about 400 or higher. Therefore, it is possible to ensure that the Q value when a measured frequency is 10 GHz will be 400 or higher in a multilayered circuit substrate having such a structure. In this way, when the Q×f value is about 4000 or higher, the composite material is sufficiently suitable for use in the high frequency area in practical application during recent years.

The multilayered circuit substrate preferably has a transverse strength of about 180 MPa or higher. If the transverse strength is about 180 MPa or higher, an electronic part mounting process should not bring about any damage to the multilayered circuit substrate, thereby making it possible to produce a sufficiently reliable multilayered circuit substrate.

Further, the glass-ceramic composite material according to the present invention can be favorably used to form first glass-ceramic layers in forming the multilayered circuit substrate which comprises a laminated body formed by a plurality of mutually laminated first glass-ceramic composite layers, and a plurality of second glass-ceramic composite layers having a dielectric constant of about 15 or more, as well as the conductive patterns provided in relation to the laminated body.

In order to obtain the laminated body having the above-described composite structure, it is necessary to sinter the first glass-ceramic composite layers together with the second glass-ceramic composite layers. In order to make possible such a co-sintering treatment, it is preferable that the first glass-ceramic composite layers and the second glass-ceramic composite layers have thermal expansion coefficients which are as close to each other as possible.

The materials having a relatively high dielectric constant of about 15 or more, such as the second glass-ceramic composite layers, usually also have a relatively high thermal expansion coefficient, so that the second glass-ceramic composite layers have a relatively high thermal expansion coefficient. Although the materials forming the first glass-ceramic composite layers are also required to have a relatively high thermal expansion coefficient, they have, at the same time, relatively low dielectric constant.

For example, if the thermal expansion coefficient of the first glass-ceramic composite layers is 8 ppm/° C. or higher, such first glass-ceramic composite layerscan be sintered together with the second glass-ceramic composite layers having a dielectric layer of about 15 or higher. On the other hand, it is a general phenomenon that it will be extremely difficult to obtain a thermal expansion coefficient of 8 ppm/° C. or higher if the dielectric constant of the sintered compact is 9 or lower.

Different from the above general phenomenon, the sintered compact of the glass-ceramic composite material of the present invention can keep its dielectric constant at about 9 or lower while at the same time making its thermal expansion coefficient at 8 ppm/° C. Therefore, if such a sintered compact is used to form the first glass-ceramic composite layers, such first glass-ceramic composite layers can be sintered together with the second glass-ceramic composite layers having a dielectric constant of about 15 or higher, thereby rendering it possible to obtain the laminated body having a composite structure including the first glass-ceramic layers and the second glass-ceramic layers.

In the following, description will be given to explain a more concrete embodiment of the multilayered circuit substrate having the laminated body of the above-described composite structure, with reference to FIG. 1 and FIG. 2.

Figure 2:
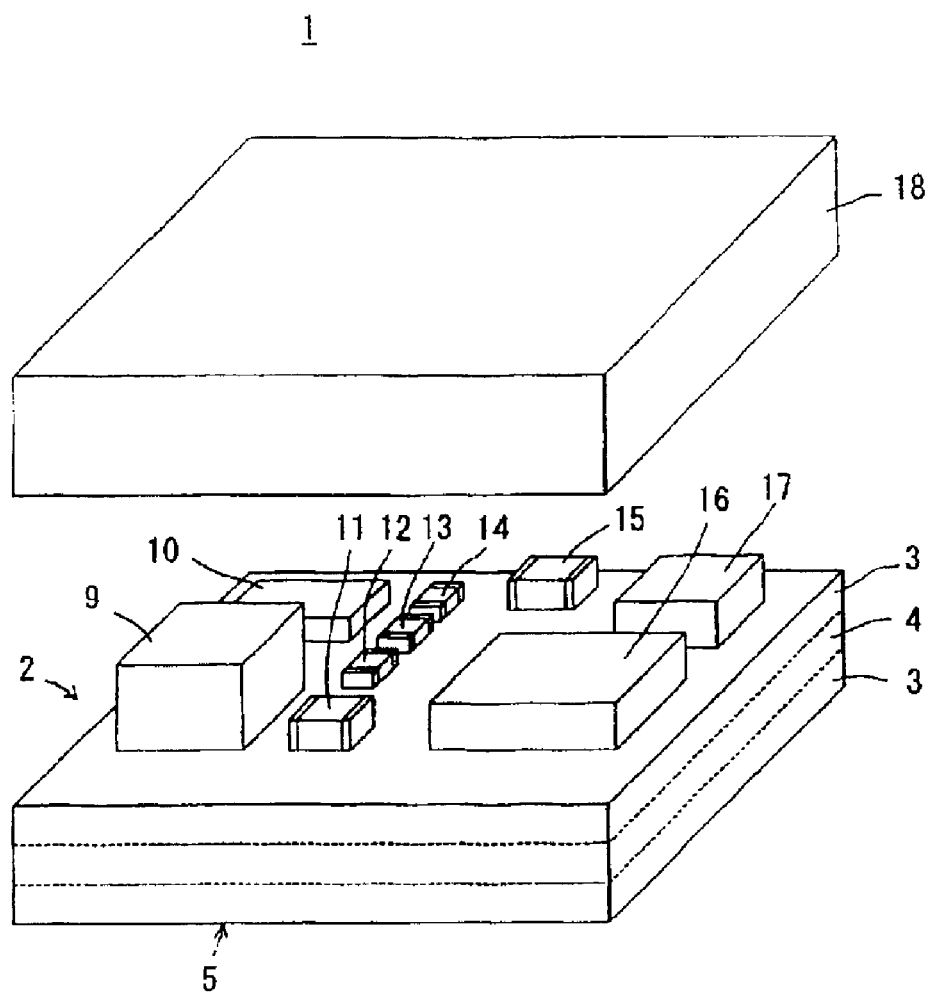
FIG. 2 is an exploded perspective view illustrating the electronic parts module 1 shown in FIG. 1.

FIG. 1 is a cross sectional view showing an electronic parts module including a multilayered circuit substrate formed according to an embodiment of the present invention. FIG. 2 is an exploded perspective view illustrating the electronic parts module.

The electronic parts module 1 shown in the drawings includes a multilayered circuit substrate 2.

As shown in the drawings, the multilayered circuit substrate 2 comprises a laminated body 5 having a composite structure which includes a plurality of mutually laminated first glass-ceramic composite layers 3 and a plurality of mutually laminated second glass-ceramic composite layers 4. In the laminated body 5, the plurality of the first glass-ceramic composite layers 3 are disposed in a manner such that the plurality of the second glass-ceramic composite layers 4 are sandwiched therebetween, with the specific portions of the first glass-ceramic composite layers 3 being connected with the specific portions of the second glass-ceramic composite layers 4.

The first glass-ceramic composite layers 3 are formed by the glass-ceramic composite materials prescribed by the present invention, having a relatively low dielectric constant of about 9 or lower. On the other hand, the second glass-ceramic composite layers 4 have a relatively high dielectric constant of about 15 or higher.

The multilayered circuit substrate 2 further includes various conductive patterns in relation to the above laminated body 5.

Here, the conductive patterns typically include internal conductor films 6 formed along the specific interfaces between the first and second glass-ceramic composite layers 3 and 4, via-hole conductors 7 extending through the specific portions of the first and second glass-ceramic composite layers 3 and 4, as well as external conductor films 8 formed on the outer surface of the laminated body 5.

Among the above internal conductor films 6, several pieces provided in relation to the second glass-ceramic composite layers 4 are disposed to produce electrostatic capacity, thereby forming a plurality of condensers.

Further, there are mounted on the upper surface of the multilayered circuit substrate 2, a plurality of chip parts 9 to 17 forming semiconductor devices, laminated condensers or inductors, which are electrically connected with the specific portions of the external conductor films 8 formed on the upper surface of the laminated body 5.

Moreover, on the upper surface of the multilayered circuit substrate 2, there is attached an electrically conductive cap 18. As shown, the electrically conductive cap 18 is electrically conducted with the specific portions of the above-described via-hole conductors 7.

In this way, the electronic parts module 1 can be mounted on a mother board (not shown), using as the connecting terminals the specific portions of the external conductor films 8 formed on the underside of the laminated body 5.

The details of the wiring provided in the multilayered circuit substrate 2 are known and will not be explained in the present specification.

In the multilayered circuit substrate 2 included in the above-described electronic parts module 1, the first glass-ceramic composite layers 3 partially forming the laminated body 5, have a dielectric constant of about 9 or lower and thus exhibit a high transmission characteristic in a high frequency area. Meanwhile, the thermal expansion coefficient of the first glass-ceramic composite layers can be kept at about 8 ppm/° C. or lower, so that the first glass-ceramic composite layers can be sintered together with the second glass-ceramic composite layers 4 having a dielectric constant of about 15 or higher.

Further, since the glass-ceramic composite layers 3 and 4 are sintered at a temperature of 1000° C. or lower, the internal conductor films 6 and the via-hole conductors 7, as well as the external conductor films 8, are all allowed to be formed by copper or silver serving as an electrically conductive component, and this has been proved as not having any problems even in the external conductor films 8.

EXAMPLES

Next, description will be given to explain a plurality of examples which have been carried out to confirm the characteristics provided by the glass-ceramic composite material of the present invention, and to find some preferred compositions for the glass-ceramic composite materials according to the present invention.

At first, powder materials having various compositions shown in the following Table 1 and Table 2 were prepared for use as the glass powders to be contained in the glass-ceramic composite materials.

Namely, in each experiment, appropriate amounts of $SiO_2$, $BaCO_3$, $MgCO_3$, $ZnO$, $B_2O_3$, $Al_2O_3$, $Li_2CO_3$, $Na_2CO_3$, $K_2CO_3$ and $TiO_2$ were respectively taken by weighing. These materials were then introduced into a platinum crucible and melted at a temperature of 1600° C. so as to obtain a molten mixture. Subsequently, the molten mixture was subjected to a quenching treatment using a roll formed by a stainless steel, thereby obtaining a glass. Afterwards, the composition of the obtained glass was analyzed by ICP emission spectral analysis method, with the results shown in the following Table 1 and Table 2.

TABLE 1

| glass number | $SiO_2$ (mol %) | BaO (mol %) | MgO (mol %) | ZnO (mol %) | $B_2O_3$ (mol %) | $Al_2O_3$ parts by weight | $Li_2O$ parts by weight | $Na_2O$ parts by weight | $K_2O$ parts by weight | $TiO_2$ parts by weight |
|---|---|---|---|---|---|---|---|---|---|---|
| *G1  | 25 | 37   | 30   | 0  | 6 | 0 | 0 | 0 | 0 | 0 |
| G2   | 30 | 35   | 30   | 0  | 5 | 0 | 0 | 0 | 0 | 0 |
| G3   | 45 | 27.5 | 22.5 | 0  | 5 | 0 | 0 | 0 | 0 | 0 |
| G4   | 60 | 20   | 15   | 0  | 5 | 0 | 0 | 0 | 0 | 0 |
| *G5  | 65 | 20   | 10   | 0  | 5 | 0 | 0 | 0 | 0 | 0 |
| *G6  | 52 | 15   | 27   | 0  | 6 | 0 | 0 | 0 | 0 | 0 |
| G7   | 50 | 20   | 25   | 0  | 5 | 0 | 0 | 0 | 0 | 0 |
| G8   | 45 | 30   | 20   | 0  | 5 | 0 | 0 | 0 | 0 | 0 |
| G9   | 40 | 40   | 15   | 0  | 5 | 0 | 0 | 0 | 0 | 0 |
| *G10 | 40 | 45   | 20   | 0  | 5 | 0 | 0 | 0 | 0 | 0 |
| *G11 | 50 | 40   | 5    | 0  | 5 | 0 | 0 | 0 | 0 | 0 |
| G12  | 45 | 40   | 10   | 0  | 5 | 0 | 0 | 0 | 0 | 0 |
| G13  | 40 | 30   | 25   | 0  | 5 | 0 | 0 | 0 | 0 | 0 |
| G14  | 35 | 20   | 40   | 0  | 5 | 0 | 0 | 0 | 0 | 0 |
| *G15 | 30 | 20   | 45   | 0  | 5 | 0 | 0 | 0 | 0 | 0 |
| *G16 | 50 | 40   | 0    | 5  | 5 | 0 | 0 | 0 | 0 | 0 |
| G17  | 45 | 40   | 0    | 10 | 5 | 0 | 0 | 0 | 0 | 0 |
| G18  | 40 | 30   | 0    | 25 | 5 | 0 | 0 | 0 | 0 | 0 |
| G19  | 35 | 20   | 0    | 40 | 5 | 0 | 0 | 0 | 0 | 0 |
| *G20 | 30 | 20   | 0    | 45 | 5 | 0 | 0 | 0 | 0 | 0 |
| *G21 | 50 | 40   | 2.5  | 2.5| 5 | 0 | 0 | 0 | 0 | 0 |
| G22  | 45 | 40   | 5    | 5  | 5 | 0 | 0 | 0 | 0 | 0 |
| G23  | 40 | 30   | 12.5 | 12.5 | 5 | 0 | 0 | 0 | 0 | 0 |
| G24  | 35 | 20   | 20   | 20 | 5 | 0 | 0 | 0 | 0 | 0 |
| *G25 | 30 | 20   | 22.5 | 22.5 | 5 | 0 | 0 | 0 | 0 | 0 |
| G26  | 46 | 34   | 20   | 0  | 0 | 0 | 0 | 0 | 0 | 0 |
| G27  | 44 | 32   | 18   | 0  | 6 | 0 | 0 | 0 | 0 | 0 |
| G28  | 43 | 28   | 18   | 0  | 11 | 0 | 0 | 0 | 0 | 0 |
| G29  | 40 | 25   | 15   | 0  | 20 | 0 | 0 | 0 | 0 | 0 |
| *G30 | 35 | 25   | 15   | 0  | 25 | 0 | 0 | 0 | 0 | 0 |

TABLE 2

| glass number | $SiO_2$ (mol %) | BaO (mol %) | MgO (mol %) | ZnO (mol %) | $B_2O_3$ (mol %) | $Al_2O_3$ parts by weight | $Li_2O$ parts by weight | $Na_2O$ parts by weight | $K_2O$ parts by weight | $TiO_2$ parts by weight |
|---|---|---|---|---|---|---|---|---|---|---|
| G31  | 44 | 32 | 18 | 0 | 6 | 10 | 0 | 0 | 0 | 0 |
| G32  | 44 | 32 | 18 | 0 | 6 | 20 | 0 | 0 | 0 | 0 |
| G33  | 44 | 32 | 18 | 0 | 6 | 30 | 0 | 0 | 0 | 0 |
| ΔG34 | 44 | 32 | 18 | 0 | 6 | 40 | 0 | 0 | 0 | 0 |
| G35  | 44 | 32 | 18 | 0 | 6 | 0 | 2 | 0 | 0 | 0 |
| G36  | 45 | 33 | 19 | 0 | 3 | 0 | 5 | 0 | 0 | 0 |
| ΔG37 | 45 | 33 | 19 | 0 | 3 | 0 | 8 | 0 | 0 | 0 |
| G38  | 44 | 32 | 18 | 0 | 6 | 0 | 0 | 2 | 0 | 0 |
| G39  | 45 | 33 | 19 | 0 | 3 | 0 | 0 | 5 | 0 | 0 |
| ΔG40 | 45 | 33 | 19 | 0 | 3 | 0 | 0 | 8 | 0 | 0 |
| G41  | 44 | 32 | 18 | 0 | 6 | 0 | 0 | 0 | 2 | 0 |
| G42  | 45 | 33 | 19 | 0 | 3 | 0 | 0 | 0 | 5 | 0 |
| ΔG43 | 45 | 33 | 19 | 0 | 3 | 0 | 0 | 0 | 8 | 0 |
| G44  | 44 | 32 | 18 | 0 | 6 | 0 | 1 | 1 | 1 | 0 |
| G45  | 45 | 33 | 19 | 0 | 3 | 0 | 2 | 2 | 1 | 0 |

TABLE 2-continued

| glass number | SiO$_2$ (mol %) | BaO (mol %) | MgO (mol %) | ZnO (mol %) | B$_2$O$_3$ (mol %) | Al$_2$O$_3$ parts by weight | Li$_2$O parts by weight | Na$_2$O parts by weight | K$_2$O parts by weight | TiO$_2$ parts by weight |
|---|---|---|---|---|---|---|---|---|---|---|
| ΔG46 | 45 | 33 | 19 | 0 | 3 | 0 | 3 | 3 | 3 | 0 |
| G47 | 44 | 32 | 18 | 0 | 6 | 10 | 2 | 0 | 0 | 0 |
| G48 | 45 | 33 | 19 | 0 | 3 | 10 | 5 | 0 | 0 | 0 |
| ΔG49 | 45 | 33 | 19 | 0 | 3 | 10 | 8 | 0 | 0 | 0 |
| G50 | 44 | 32 | 18 | 0 | 6 | 10 | 0 | 2 | 0 | 0 |
| G51 | 45 | 33 | 19 | 0 | 3 | 10 | 0 | 5 | 0 | 0 |
| ΔG52 | 45 | 33 | 19 | 0 | 3 | 10 | 0 | 8 | 0 | 0 |
| G53 | 44 | 32 | 18 | 0 | 6 | 10 | 0 | 0 | 2 | 0 |
| G54 | 45 | 33 | 19 | 0 | 3 | 10 | 0 | 0 | 5 | 0 |
| ΔG55 | 45 | 33 | 19 | 0 | 3 | 10 | 0 | 0 | 8 | 0 |
| G56 | 44 | 32 | 18 | 0 | 6 | 10 | 1 | 1 | 1 | 0 |
| G57 | 45 | 33 | 19 | 0 | 3 | 10 | 2 | 2 | 1 | 0 |
| ΔG58 | 45 | 33 | 19 | 0 | 3 | 10 | 3 | 3 | 3 | 0 |
| G59 | 40 | 30 | 25 | 0 | 5 | 0 | 0 | 0 | 0 | 1 |
| G60 | 40 | 30 | 25 | 0 | 5 | 0 | 0 | 0 | 0 | 2 |
| ΔG61 | 40 | 30 | 25 | 0 | 5 | 0 | 0 | 0 | 0 | 3 |

In the above Table 1 and Table 2, those glasses marked by symbols * represent glass powders having compositions not falling within the ranges of the present invention, and those marked by symbols Δ represent glass powders having compositions falling within the ranges of the present invention, but not falling within the preferred ranges.

Further, SiO$_2$, BaO, MgO, ZnO and B$_2$O$_3$ are all represented by mol % in the above Table 1 and Table 2, while Al$_2$O$_3$, Li$_2$O, Na$_2$O, K$_2$O are all represented by "parts by weight" when the total amount of SiO$_2$, BaO, MgO, ZnO and B$_2$O$_3$ is set to be 100 parts by weight.

Using a ball-mill consisting of an alumina material, the glass materials having the compositions shown in the above Table 1 and Table 2 were milled into glass powders having an average particle diameter of 1.5 μm, thereby obtaining the glass powders for use in forming the glass-ceramic composite material.

On the other hand, an amount of Al$_2$O$_3$ powder and an amount of MgAl$_2$O$_4$ powder, each having an average particle diameter of about 1.0 μm, were prepared for use as ceramic powder to be contained in the glass-ceramic composite material of the present invention.

Next, in order to obtain the glass-ceramic composite materials in various samples shown in the following Table 3 through Table 7, the glass powders and the ceramic powders were mixed together, followed by adding CuO powder (except for some specific samples).

TABLE 3

| sample number | glass powder Kind | glass powder adding amount wt (%) | ceramic powder Al$_2$O$_3$ wt (%) | ceramic powder MgAl$_2$O$_4$ wt (%) | CuO powder parts by weight | sintering temperature (° C.) | relative density (%) | thermal expansion coefficient (ppm/° C.) | ε | Q | transverse strength (MPa) | crystal phase |
|---|---|---|---|---|---|---|---|---|---|---|---|---|
| *1 | G1 | 80 | 20 | 0 | 1 | 900 | 98 | 11.9 | 8.8 | 350 | 160 | BAS, BMS, BA |
| 2 | G2 | 80 | 20 | 0 | 1 | 900 | 98 | 11.3 | 8.3 | 400 | 200 | BAS, BMS, BA |
| 3 | G3 | 80 | 20 | 0 | 1 | 900 | 98 | 10.3 | 7.6 | 460 | 220 | BAS, BMS |
| 4 | G3 | 70 | 30 | 0 | 1 | 900 | 97 | 9.8 | 7.9 | 470 | 230 | BAS, BMS |
| 5 | G3 | 60 | 5 | 35 | 1 | 900 | 98 | 10.9 | 7.7 | 450 | 220 | BAS, BMS, MA |
| 6 | G4 | 80 | 20 | 0 | 1 | 900 | 99 | 8.9 | 6.8 | 450 | 190 | BAS |
| *7 | G5 | failed to be glassified | | | | | | | | | | |
| *8 | G6 | 80 | 20 | 0 | 1 | 900 | 99 | 9.0 | 7.1 | 340 | 250 | BAS, BMS |
| 9 | G7 | 80 | 20 | 0 | 1 | 900 | 99 | 9.4 | 7.4 | 400 | 230 | BAS, BMS |
| 10 | G8 | 80 | 20 | 0 | 1 | 900 | 99 | 10.2 | 7.7 | 460 | 200 | BAS, BA |
| 11 | G8 | 70 | 30 | 0 | 1 | 900 | 98 | 9.7 | 7.9 | 470 | 220 | BAS, BA |
| 12 | G8 | 60 | 5 | 35 | 1 | 900 | 98 | 10.9 | 7.8 | 440 | 210 | BAS, BMS, BA, MA |
| 13 | G9 | 80 | 20 | 0 | 1 | 900 | 98 | 10.8 | 7.9 | 470 | 180 | BAS, BA |
| *14 | G10 | 80 | 20 | 0 | 1 | 900 | 98 | 11.2 | 8.3 | 500 | 150 | BAS, BA |
| *15 | G11 | 80 | 20 | 0 | 1 | 900 | 98 | 11.4 | 7.4 | 350 | 240 | BAS, BA |
| 16 | G12 | 80 | 20 | 0 | 1 | 900 | 99 | 11.0 | 7.7 | 400 | 220 | BAS, BA |
| 17 | G13 | 80 | 20 | 0 | 1 | 900 | 98 | 10.4 | 7.9 | 450 | 200 | BAS, BMS, BA |
| 18 | G13 | 70 | 30 | 0 | 1 | 900 | 98 | 9.9 | 8.1 | 460 | 210 | BAS, BMS, BA |
| 19 | G13 | 60 | 5 | 35 | 1 | 900 | 98 | 11.2 | 8.0 | 440 | 200 | BAS, BMS, BA, MA |
| 20 | G14 | 80 | 20 | 0 | 1 | 900 | 98 | 10.2 | 8.1 | 460 | 180 | BAS, BMS, MA |

TABLE 4

| sample number | Glass powder Kind | Glass powder adding amount wt (%) | ceramic powder Al$_2$O$_3$ wt (%) | ceramic powder MgAl$_2$O$_4$ wt (%) | CuO powder parts by weight | sintering temperature (° C.) | relative density (%) | thermal expansion coefficient (ppm/° C.) | ε | Q | transverse strength (MPa) | crystal phase |
|---|---|---|---|---|---|---|---|---|---|---|---|---|
| *21 | G15 | 80 | 20 | 0 | 1 | 900 | 99 | 9.9 | 8.4 | 480 | 150 | BAS, BMS, MA |
| *22 | G16 | 80 | 20 | 0 | 1 | 900 | 99 | 11.2 | 7.4 | 350 | 240 | BAS |
| 23 | G17 | 80 | 20 | 0 | 1 | 900 | 99 | 10.8 | 7.6 | 400 | 230 | BAS |
| 24 | G18 | 80 | 20 | 0 | 1 | 900 | 98 | 10.4 | 7.9 | 450 | 200 | BAS, BA, ZA |
| 25 | G18 | 70 | 30 | 0 | 1 | 900 | 97 | 9.9 | 8.2 | 460 | 220 | BAS, BA, ZA |
| 26 | G18 | 60 | 5 | 35 | 1 | 900 | 98 | 11.1 | 8.0 | 440 | 200 | BAS, ZA |
| 27 | G19 | 80 | 20 | 0 | 1 | 900 | 98 | 10.1 | 8.2 | 470 | 180 | BAS, ZA |
| *28 | G20 | 80 | 20 | 0 | 1 | 900 | 98 | 9.7 | 8.5 | 490 | 150 | BAS, ZA |
| *29 | G21 | 80 | 20 | 0 | 1 | 900 | 99 | 11.1 | 7.4 | 360 | 250 | BAS |
| 30 | G22 | 80 | 20 | 0 | 1 | 900 | 98 | 10.8 | 7.6 | 400 | 230 | BAS |
| 31 | G23 | 80 | 20 | 0 | 1 | 900 | 99 | 10.3 | 8.0 | 450 | 210 | BAS, BA |
| 32 | G23 | 70 | 30 | 0 | 1 | 900 | 98 | 9.7 | 8.3 | 460 | 230 | BAS, BA |
| 33 | G23 | 60 | 5 | 35 | 1 | 900 | 98 | 11.1 | 8.1 | 440 | 210 | BAS, BMS, MA |
| 34 | G24 | 80 | 20 | 0 | 1 | 900 | 98 | 10.1 | 8.2 | 470 | 180 | BAS, MA, ZA |
| *35 | G25 | 80 | 20 | 0 | 1 | 900 | 98 | 9.7 | 8.5 | 490 | 140 | BAS, MA, ZA |
| 36 | G26 | 80 | 20 | 0 | 1 | 900 | 97 | 10.0 | 7.8 | 450 | 230 | BAS |
| 37 | G27 | 80 | 20 | 0 | 1 | 900 | 99 | 10.1 | 7.7 | 450 | 220 | BAS |
| 38 | G28 | 80 | 20 | 0 | 1 | 900 | 98 | 9.7 | 7.7 | 450 | 200 | BAS |
| 39 | G29 | 80 | 20 | 0 | 1 | 850 | 98 | 9.2 | 7.8 | 440 | 180 | BAS |
| *40 | G30 | 80 | 20 | 0 | 1 | 850 | 98 | 8.8 | 7.6 | 450 | 150 | BAS |

TABLE 5

| sample number | Glass powder Kind | Glass powder adding amount wt (%) | ceramic powder Al$_2$O$_3$ wt (%) | ceramic powder MgAl$_2$O$_4$ wt (%) | CuO powder parts by weight | sintering temperature (° C.) | relative density (%) | thermal expansion coefficient (ppm/° C.) | ε | Q | transverse strength (MPa) | crystal phase |
|---|---|---|---|---|---|---|---|---|---|---|---|---|
| 41 | G31 | 80 | 20 | 0 | 1 | 900 | 99 | 9.6 | 8.0 | 430 | 240 | BAS, BA |
| 42 | G32 | 80 | 20 | 0 | 1 | 900 | 98 | 9.3 | 8.2 | 410 | 260 | BAS, BA |
| 43 | G33 | 80 | 20 | 0 | 1 | 950 | 99 | 9.1 | 8.5 | 400 | 280 | BAS, BA |
| Δ44 | G34 | 80 | 20 | 0 | 1 | 900 | 98 | 8.8 | 8.8 | 350 | 310 | BAS, BA |
| 45 | G35 | 80 | 20 | 0 | 1 | 900 | 98 | 10.4 | 7.8 | 440 | 220 | BAS |
| 46 | G35 | 70 | 30 | 0 | 1 | 900 | 98 | 9.8 | 8.1 | 450 | 240 | BAS |
| 47 | G35 | 60 | 5 | 35 | 1 | 900 | 98 | 11.0 | 7.9 | 430 | 220 | BAS, BMS |
| 48 | G36 | 80 | 20 | 0 | 1 | 900 | 99 | 10.8 | 7.8 | 400 | 200 | BAS |
| Δ49 | G37 | 80 | 20 | 0 | 1 | 900 | 98 | 11.2 | 7.9 | 360 | 170 | BAS |
| 50 | G38 | 80 | 20 | 0 | 1 | 900 | 98 | 10.4 | 7.9 | 430 | 210 | BAS |
| 51 | G38 | 70 | 30 | 0 | 1 | 900 | 98 | 9.9 | 8.2 | 440 | 230 | BAS, BA |
| 52 | G38 | 60 | 5 | 35 | 1 | 900 | 98 | 11.1 | 8.0 | 420 | 220 | BAS, BMS, MA |
| 53 | G39 | 80 | 20 | 0 | 1 | 850 | 98 | 10.7 | 7.8 | 400 | 190 | BAS |
| Δ54 | G40 | 80 | 20 | 0 | 1 | 850 | 98 | 10.9 | 7.8 | 350 | 160 | BAS |
| 55 | G41 | 80 | 20 | 0 | 1 | 900 | 98 | 10.3 | 7.8 | 440 | 220 | BAS, BA |
| 56 | G41 | 70 | 30 | 0 | 1 | 900 | 98 | 9.8 | 8.1 | 450 | 240 | BAS, BA |
| 57 | G41 | 60 | 5 | 35 | 1 | 900 | 98 | 11.0 | 7.9 | 430 | 230 | BAS, BMS, BA, MA |
| 58 | G42 | 80 | 20 | 0 | 1 | 850 | 99 | 10.5 | 7.9 | 420 | 180 | BAS, BA |
| Δ59 | G43 | 80 | 20 | 0 | 1 | 850 | 99 | 10.8 | 7.9 | 400 | 150 | BAS, BA |
| 60 | G44 | 80 | 20 | 0 | 1 | 900 | 99 | 10.4 | 7.8 | 440 | 220 | BAS, BA |

TABLE 6

| sample number | Glass powder Kind | Glass powder adding amount wt (%) | ceramic powder Al$_2$O$_3$ wt (%) | ceramic powder MgAl$_2$O$_4$ wt (%) | CuO powder parts by weight | sintering temperature (° C.) | relative density (%) | thermal expansion coefficient (ppm/° C.) | ε | Q | transverse strength (MPa) | crystal phase |
|---|---|---|---|---|---|---|---|---|---|---|---|---|
| 61 | G44 | 70 | 30 | 0 | 1 | 900 | 98 | 9.7 | 8.1 | 450 | 230 | BAS, BA |
| 62 | G44 | 60 | 5 | 35 | 1 | 900 | 98 | 11.2 | 7.9 | 430 | 210 | BAS, BMS, BA, MA |
| 63 | G45 | 80 | 20 | 0 | 1 | 850 | 99 | 10.7 | 7.8 | 400 | 180 | BAS, BA |
| Δ64 | G46 | 80 | 20 | 0 | 1 | 850 | 98 | 10.9 | 7.8 | 350 | 150 | BAS, BA |
| 65 | G47 | 90 | 10 | 0 | 1 | 900 | 98 | 10.4 | 7.8 | 440 | 200 | BAS |

TABLE 6-continued

| | Glass powder | | ceramic powder | | CuO powder | sintering | relative | thermal expansion | | | transverse | |
|---|---|---|---|---|---|---|---|---|---|---|---|---|
| sample number | Kind | adding amount wt (%) | Al$_2$O$_3$ wt (%) | MgAl$_2$O$_4$ wt (%) | parts by weight | temperature (°C.) | density (%) | coefficient (ppm/°C.) | ε | Q | strength (MPa) | crystal phase |
| 66 | G48 | 90 | 10 | 0 | 1 | 850 | 99 | 10.7 | 7.7 | 400 | 180 | BAS |
| Δ67 | G49 | 90 | 10 | 0 | 1 | 850 | 99 | 10.9 | 7.6 | 340 | 150 | BAS |
| 68 | G50 | 90 | 10 | 0 | 1 | 900 | 98 | 10.5 | 7.9 | 430 | 200 | BAS |
| 69 | G51 | 90 | 10 | 0 | 1 | 850 | 99 | 10.7 | 7.8 | 400 | 190 | BAS |
| Δ70 | G52 | 90 | 10 | 0 | 1 | 850 | 99 | 11.0 | 7.7 | 350 | 160 | BAS |
| 71 | G53 | 90 | 10 | 0 | 1 | 900 | 98 | 10.3 | 7.8 | 440 | 210 | BAS, BA |
| 72 | G54 | 90 | 10 | 0 | 1 | 850 | 99 | 10.6 | 7.9 | 420 | 180 | BAS, BA |
| Δ73 | G55 | 90 | 10 | 0 | 1 | 850 | 99 | 10.9 | 7.9 | 390 | 140 | BAS, BA |
| 74 | G56 | 90 | 10 | 0 | 1 | 900 | 98 | 10.4 | 7.8 | 440 | 200 | BAS, BA |
| 75 | G57 | 90 | 10 | 0 | 1 | 850 | 99 | 10.7 | 7.8 | 400 | 180 | BAS, BA |
| Δ76 | G58 | 90 | 10 | 0 | 1 | 850 | 99 | 11.1 | 7.8 | 350 | 140 | BAS, BA |
| *77 | G29 | 49 | 51 | 0 | 2 | 950 | 94 | — | — | — | — | BAS, BA |
| 78 | G29 | 50 | 50 | 0 | 2 | 950 | 97 | 8.9 | 8.3 | 440 | 250 | BAS, BA |
| 79 | G28 | 60 | 40 | 0 | 2 | 900 | 97 | 8.8 | 8.1 | 450 | 250 | BAS, BA |
| 80 | G27 | 70 | 30 | 0 | 1 | 900 | 98 | 9.5 | 8.0 | 460 | 230 | BAS, BA |

TABLE 7

| | glass powder | | ceramic powder | | CuO powder | sintering | relative | thermal expansion | | | transverse | |
|---|---|---|---|---|---|---|---|---|---|---|---|---|
| sample number | Kind | Adding amount wt (%) | Al$_2$O$_3$ wt (%) | MgAl$_2$O$_4$ wt (%) | parts by weight | temperature (°C.) | density (%) | coefficient (ppm/°C.) | ε | Q | strength (MPa) | crystal phase |
| 81 | G31 | 90 | 10 | 0 | 1 | 900 | 99 | 9.8 | 7.8 | 430 | 210 | BAS |
| 82 | G32 | 100 | 0 | 0 | 1 | 900 | 99 | 9.7 | 7.9 | 410 | 190 | BAS |
| *83 | G29 | 49 | 26 | 25 | 2 | 950 | 95 | — | — | — | — | BAS, BMS, MA |
| 84 | G29 | 50 | 25 | 25 | 2 | 950 | 97 | 9.1 | 8.0 | 420 | 240 | BAS, BMS, MA |
| 85 | G28 | 60 | 20 | 20 | 1 | 900 | 97 | 9.1 | 7.9 | 430 | 230 | BAS, BMS, MA |
| 86 | G27 | 70 | 15 | 15 | 1 | 900 | 98 | 10.4 | 7.7 | 420 | 220 | BAS, BMS, MA |
| 87 | G31 | 80 | 10 | 10 | 1 | 900 | 98 | 9.5 | 7.6 | 430 | 210 | BAS, BMS, MA |
| 88 | G32 | 90 | 5 | 5 | 1 | 900 | 99 | 9.3 | 7.2 | 420 | 190 | BAS, BMS, MA |
| 89 | G27 | 80 | 20 | 0 | 0 | 900 | 97 | 10.1 | 7.8 | 460 | 220 | BAS |
| 90 | G27 | 80 | 20 | 0 | 2 | 900 | 99 | 10.1 | 7.8 | 420 | 230 | BAS |
| 91 | G27 | 80 | 20 | 0 | 3 | 900 | 99 | 10.2 | 7.8 | 400 | 220 | BAS |
| Δ92 | G27 | 80 | 20 | 0 | 4 | 900 | 99 | 10.2 | 7.8 | 360 | 220 | BAS |
| 93 | G59 | 80 | 20 | 0 | 1 | 900 | 98 | 10.4 | 7.9 | 450 | 200 | BAS, BMS, BA |
| 94 | G60 | 80 | 20 | 0 | 1 | 900 | 98 | 9.9 | 8.2 | 420 | 220 | BAS, BMS, BA |
| Δ95 | G61 | 80 | 20 | 0 | 1 | 900 | 98 | 9.5 | 8.4 | 370 | 230 | BAS, BMS, BA |

In the above Table 3 through Table 7, sample numbers marked by symbols * represent glass-ceramic powders not falling within the ranges of the present invention, and those marked by symbols Δ represent glass-ceramic powders falling within the ranges of the present invention, but not falling within the preferred ranges.

Further, the "kind" of "glass powders" in the above Table 3 through Table 7 correspond to "glass numbers" shown in Table 1 and Table 2.

In the above Table 3 through Table 7, the amount of each glass powder as well as the amount of each of Al$_2$O$_3$ and MgAl$_2$O$_4$ serving as ceramic powders are all represented by wt % with respect to a total amount including a glass powder and a ceramic powder. However, the amount of CuO powder is represented by "parts by weight" with respect to 100 parts by weight of the total amount of glass powder and ceramic powder.

Note that glass powder "G5" which was to be used in sample 7 shown in Table 3, failed to be glassified, so that subsequent processing steps relating to this sample were not carried out.

Next, an appropriate amount of binder was added to the mixture including the glass powder and the ceramic powder as well as the CuO powder and formed through a mixing process in accordance with the percentages shown in Table 3 through Table 7, so as to carry out a granulating process to produce granular particles. The obtained granular particles were then subjected to a molding process which employed a pressure of 2000 kg/cm$^2$, thereby effecting a molding formation using this pressure and thus producing a plurality of circular plate-like green molded products having a diameter of 17 mm and a thickness of 9 mm.

The green molded products were then sintered in an atmospheric air for 2 hours at the sintering temperatures shown in Table 3 through Table 7, thereby obtaining sintered bodies serving as samples.

Next, the obtained samples shown in Table 3 through Table 7, the obtained samples were tested so as to measure their relative densities, thermal expansion coefficients, dielectric constants ε, Q values and transverse strengths, thereby evaluating the precipitated crystal phases.

The dielectric constants ε and the Q values were measured by a double end short circuit type dielectric resonator method, thereby measuring the values at 10 GHz. The transverse strengths were measured by three-point bending method (JIS R 1601).

The crystal phases were identified by powder X-ray diffraction method. In the columns "crystal phase" of Table 3 through Table 7, "BAS" represents $BaO.Al_2O_3.2SiO_2$ ($BaAl_2Si_2O_8$) crystal, "BA" represents $BaO.Al_2O_3$ ($BaAl_2O_4$) crystal, "BMS" represents $BaO.2MgO.2SiO_2$ ($BaMg_2Si_2O_7$) crystal, "MA" represents $MgO.Al_2O_3$ ($MgAl_2O_4$) crystal, and "ZA" represents $ZnO.Al_2O_3$ ($ZnAl_2O_4$) crystal. Other crystal phases not including those listed above are also possible to be precipitated, but an improvement in Q value can be seen only in the above-listed crystal phases.

Further, although not shown in Table 3 through Table 7, the alumina crystal amount in each of the sintered bodies forming various samples were also evaluated. Measurement was performed on the mixture of glass powder and ceramic powder in each sample using the X-ray diffraction method so as to measure a diffraction peak intensity value. In this way, the alumina amount was measured, thereby obtaining an alumina crystal amount from the alumina amount as well as from an analytical curve of an X-ray diffraction peak intensity value.

In Table 3 through Table 7, all samples neither marked by * nor marked by Δ, have their percentages of alumina crystals in the sintered bodies at half or lower than half of the percentages of the alumina powders initially added as ceramic powders.

As may be understood from the above Table 1, Table 2 and Table 3 through Table 7, and from samples neither marked by * nor marked by Δ, it is possible to perform a sintering process at a relatively low temperature of 850 to 1000° C., thereby realizing a relative density of 97% or higher as well as a dielectric constant ∈ which is as low as 6.5 to 9. On the other hand, it is possible to realize a thermal expansion coefficient which is as high as 8 to 12 ppm/° C., a Q value (when a measured frequency is 10 GHz) which is 400 or higher, and a transverse strength which is as high as 180 MPa.

In contrast to the above, with regard to the samples which are marked by * and do not fall within the ranges of the present invention, and with regard to the samples which are marked by Δ and do not fall within the preferred ranges of the present invention, their Q values were less than 400 or their transverse strengths were less than 180 MPa.

In the samples 77 and 83 not falling within the ranges of the present invention, the amounts of the glass powders were all less than 50 wt % and their relative densities became low. Their thermal expansion coefficients, dielectric constants ∈ Q values and transverse strengths were not measured.

With the use of the glass-ceramic composite material of the present invention in forming an improved multilayered circuit substrate, it is possible to obtain a multilayered circuit substrate whose Q×f value (at 10 GHz) is as high as 4000 GHz using a sintering temperature of 850 to 1000° C. Further, it is also possible to enable the thermal expansion coefficient of the glass-ceramic composite material to be increased to 8 ppm/° C. or higher.

Therefore, it is possible to sinter, for example, the above material together with another material having a relatively high thermal expansion coefficient as well as a relatively high dielectric constant. Thus, it becomes possible to manufacture, without problem, a multilayered circuit substrate comprising a laminated body having a composite structure including first glass-ceramic composite layers formed by the glass-ceramic composite material of the present invention as well as second glass-ceramic composite layers having a dielectric constant of about 15 or more.

Further, in such a multilayered circuit substrate, it is possible to use copper or silver as the electrically conductive component, thereby rendering the multilayered circuit substrate suitable for use in a high frequency area.

What is claimed is:

1. A glass-ceramic composite material comprising a glass powder and an alumina-containing ceramic powder, wherein the glass powder comprises:

about 30 to 60 mol % of a silicon oxide calculated as $SiO_2$;

about 20 to 40 mol % of a barium oxide calculated as BaO;

0 to about 40 mol % of a magnesium oxide calculated as MgO;

0 to about 40 mol % of a zinc oxide calculated as ZnO;

0 to about 20 mol % of a boron oxide calculated as $B_2O_3$;

wherein the total content of MgO and ZnO is about 10 to 40 mol %;

wherein the content of the glass powder is at least about 50 wt % with respect to the entire amount of the glass powder and the ceramic powder; and wherein the glass-ceramic composite material is capable of precipitating a $BaO.Al_2O_3.2SiO_2$ ($BaAl_2Si_2O_8$) crystal phase in a compact obtained by sintering the mixture of the glass powder and the ceramic powder at a temperature of at least 850° C. and the percentage of alumina crystal phase in the sintered compact is at most half of the percentage of the alumina powder in the unsintered material, and wherein said glass-ceramic composite material further comprises a positive amount of up to about 3 parts by weight of a copper oxide calculated as CuO by weight of the glass powder and the ceramic powder.

2. The glass-ceramic composite material according to claim 1, wherein the dielectric constant of the glass powder is about 7 or lower and the dielectric constant of the ceramic powder is about 10 or lower.

3. The glass-ceramic composite material according to claim 2, wherein the content of the glass powder is about 60 to 90 wt % with respect to the total amount of the glass powder and the ceramic powder.

4. The glass-ceramic composite material according to claim 3, wherein the glass powder comprises about 35 to 55 mol % of a silicon oxide calculated as $SiO_2$, about 20 to 40 mol % of a barium oxide calculated as BaO, about 10 to 30 mol % of a magnesium oxide calculated as MgO, 0 to about 10 mol % of a zinc oxide calculated as ZnO, 0 to about 10 mol % of a boron oxide calculated about $B_2O_3$, with the total content of MgO and ZnO being about 10 to 30 mol %.

5. The glass-ceramic composite material according to claim 4, wherein based on said silicon oxide, barium oxide, magnesium oxide, zinc oxide and boron oxide being 100 parts by weight, said glass powder further contains up to about 2 parts by weight of a titanium oxide calculated in accordance With $TiO_2$; up to about 30 parts by weight of an aluminum oxide calculated in accordance with $Al_2O_3$; up to about 5 parts by weight of lithium oxide calculated as $Li_2O$, sodium oxide calculated as $Na_2O$, potassium oxide calculated as $K_2O$, or a mixture thereof.

6. The glass-ceramic composite material according to claim 2, wherein the ceramic powder comprises alumina or alumina and spinel.

7. A sintered glass-ceramic composite material compact comprising a sintered mixture of glass powder and ceramic powder according to claim 1 and containing at least one crystal phase selected from the group consisting of BaO.Al$_2$O$_3$ (BaAl$_2$O$_4$) crystal phase, BaO.2MgO.2SiO$_2$ (BaMg$_2$Si$_2$O$_7$) crystal phase, MgO.Al$_2$O$_3$ (MgAl$_2$O$_4$) crystal phase and ZnO.Al$_2$O$_3$ (ZnAl$_2$O$_4$) crystal phase.

8. The sintered glass-ceramic composite material compact according to claim 7, wherein said sintered compact has a dielectric constant of about 9 or lower.

9. The sintered glass-ceramic composite material compact according to claim 8, wherein the percentage of its BaQ.Al$_2$O$_3$.2SiO$_2$ (BaAl$_2$Si$_2$O$_8$) crystal phase is about 1 to 80 wt %.

10. The sintered glass-ceramic composite material compact according to claim 8, wherein the glass powder sintered comprises about 35 to 55 mol % of a silicon oxide calculated as SiO$_2$, about 20 to 40 mol % of a barium oxide calculated as BaO, about 10 to 30 mol % of a magnesium oxide calculated as MgO, 0 to about 10 mol % of a zinc oxide calculated as ZnO, 0 to about 10 mol % of a boron oxide calculated about B$_2$O$_3$, with the total content of MgO and ZnO being about 10 to 30 mol %.

11. A multilayered circuit substrate comprising a laminated body formed by a plurality of glass-ceramic composite layers in combination with at least one conductive pattern, wherein at least one of the glass-ceramic composite layers is a sintered compact according to claim 7.

12. A multilayered circuit substrate comprising a laminated body formed by a plurality of glass-ceramic composite layers in combination with at least one conductive pattern, wherein at least one of the glass-ceramic composite layers is a sintered compact according to claim 8 and at least one of the glass-ceramic composite layers is a second glass-ceramic composite layer having a dielectric constant of about 15 or higher.

13. The multilayered circuit substrate according to claim 11, wherein the conductive patterns comprises copper or silver.

14. The multilayered circuit substrate according to claim 11, wherein the sintered compact further contains at least one crystal selected from the group consisting of BaO.Al$_2$O$_3$ (BaAl$_2$O$_4$) crystal phase, BaO.2MgO.2SiO$_2$ (BaMg$_2$Si$_2$O$_7$) crystal phase, MgO.Al$_2$O$_3$ (MgAl$_2$O$_4$) crystal phase and ZnO.Al$_2$O$_3$ (ZnAl$_2$O$_4$) crystal phase.

15. The multilayered circuit substrate according to claim 11, wherein the sintered compact is such that the percentage of its BaO.Al$_2$O$_3$.2SiO$_2$ (BaAl$_2$Si$_2$O$_8$) crystal phase is about 1 to 80 wt %.

16. The multilayered circuit substrate according to claim 11, wherein the glass powder sintered comprises about 35 to 55 mol % of a silicon oxide calculated as SiO$_2$, about 20 to 40 mol % of a barium oxide calculated as BaO, about 10 to 30 mol % of a magnesium oxide calculated as MgO, 0 to about 10 mol % of a zinc oxide calculated as ZnO, 0 to about 10 mol % of a boron oxide calculated as B$_2$O$_3$, with the total content of MgO and ZnO being about 10 to 30 mol %.

17. The multilayered circuit substrate according to claim 11, wherein the content of the glass powder in the sintered compact is about 60 to 90 wt % with respect to the total amount of the glass powder and the ceramic powder.

18. The multilayered circuit substrate according to claim 11, wherein based on said silicon oxide, barium oxide, magnesium oxide, zinc oxide and boron oxide being 100 parts by weight, said glass powder sintered further contained up to about 2 parts by weight of a titanium oxide calculated in accordance with TiO$_2$; up to about 30 parts by weight of an aluminum oxide calculated in accordance with Al$_2$O$_3$; up to about 5 parts by weight of lithium oxide calculated as Li$_2$O, sodium oxide calculated as Na$_2$O, potassium oxide calculated as K$_2$O, or a mixture thereof.

* * * * *